US010791655B2

(12) United States Patent
Cader et al.

(10) Patent No.: US 10,791,655 B2
(45) Date of Patent: Sep. 29, 2020

(54) ROUTING A COOLING MEMBER ALONG A BOARD (71) Applicant: Hewlett Packard Enterprise Development LP, Houston, TX (US)

(72) Inventors: Tahir Cader, Liberty Lake, WA (US); Minh H. Nguyen, Katy, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/570,692

(22) PCT Filed: Jan. 22, 2016

(86) PCT No.: PCT/US2016/014540
§ 371 (c)(1),
(2) Date: Oct. 30, 2017

(87) PCT Pub. No.: WO2017/127109
PCT Pub. Date: Jul. 27, 2017

(65) Prior Publication Data
US 2018/0359881 A1 Dec. 13, 2018

(51) Int. Cl.
*H05K 7/20* (2006.01)
*H01L 23/34* (2006.01)
(Continued)

(52) U.S. Cl.
CPC .......... *H05K 7/20772* (2013.01); *G06F 1/20* (2013.01); *H01L 23/34* (2013.01); *H01L 23/473* (2013.01);
(Continued)

(58) Field of Classification Search
CPC .......... H05K 7/20772; H05K 7/20781; H05K 7/20254; H05K 7/20272
(Continued)

(56) References Cited

U.S. PATENT DOCUMENTS 4,839,774 A * 6/1989 Hamburgen .......... H01L 23/467
247/E23.099
5,285,347 A * 2/1994 Fox .......................... G06F 1/20
165/80.3
(Continued)

FOREIGN PATENT DOCUMENTS

CN 101442893 A 5/2009
EP 0456423 11/1991
(Continued)

OTHER PUBLICATIONS

KR-20140071029-A, Machine English Translation (Year: 2014).*
(Continued)

*Primary Examiner* — Anatoly Vortman
(74) *Attorney, Agent, or Firm* — Hewlett Packard Enterprise Patent Department (57) ABSTRACT Examples herein disclose a system including a board and a cooling member. The board includes a first surface, a second surface, and a midpoint between the first and the surface, the boards supports an electrical component on the first surface. The cooling member is routed along the second surface of the board and delivers cooling liquid to the electrical component by crossing the midpoint of the board from the second surface to the first surface. The cooling member routes heated liquid from the electrical component by crossing the midpoint of the board from the first surface to the second surface.

20 Claims, 7 Drawing Sheets (51) Int. Cl.
*G06F 1/20* (2006.01)
*H01L 23/473* (2006.01)

(52) U.S. Cl.
CPC .......... *H05K 7/20* (2013.01); *H05K 7/20254* (2013.01); *H05K 7/20781* (2013.01); *H05K 7/20272* (2013.01)

(58) Field of Classification Search
USPC ....................................................... 361/699
See application file for complete search history.

(56) References Cited

U.S. PATENT DOCUMENTS

| | | | | |
|---|---|---|---|---|
| 5,343,358 A * | 8/1994 | Hilbrink | | H05K 7/208 165/104.33 |
| 5,406,807 A * | 4/1995 | Ashiwake | | H01L 23/427 165/908 |
| 5,510,958 A * | 4/1996 | Shimabara | | H01L 23/473 257/714 |
| 6,008,987 A * | 12/1999 | Gale | | H05K 1/0207 165/104.33 |
| 6,400,565 B1 * | 6/2002 | Shabbir | | G06F 1/20 165/104.33 |
| 6,556,439 B2 * | 4/2003 | Shibasaki | | G06F 1/203 165/80.2 |
| 6,604,370 B2 * | 8/2003 | Bash | | G06F 1/20 257/E23.1 |
| 6,807,056 B2 * | 10/2004 | Kondo | | G06F 1/20 165/104.33 |
| 6,937,474 B2 * | 8/2005 | Lee | | H01L 23/427 165/104.21 |
| 7,012,807 B2 * | 3/2006 | Chu | | G06F 1/20 165/104.33 |
| 7,252,139 B2 * | 8/2007 | Novotny | | F25D 19/00 165/80.2 |
| 7,336,487 B1 * | 2/2008 | Chrysler | | H01L 23/473 165/104.33 |
| 7,428,150 B1 * | 9/2008 | Stefanoski | | G06F 1/185 165/80.4 |
| 7,428,151 B2 * | 9/2008 | Sonnabend | | G06F 1/20 361/698 |
| 7,474,526 B2 * | 1/2009 | Fujiwara | | G06F 1/203 165/104.21 |
| 7,483,261 B2 * | 1/2009 | Mikubo | | H01L 23/473 361/669 |
| 7,960,655 B2 | 6/2011 | Han | | |
| 8,351,206 B2 * | 1/2013 | Campbell | | H05K 7/20809 361/691 |
| 8,400,769 B2 * | 3/2013 | Tomioka | | H05K 7/20336 165/122 |
| 8,659,897 B2 | 2/2014 | Meijer | | |
| 8,704,352 B2 * | 4/2014 | Hisano | | H01L 23/3128 257/686 |
| 2004/0221604 A1 * | 11/2004 | Ota | | H05K 7/20781 62/259.2 |
| 2004/0264142 A1 * | 12/2004 | Mejia | | G06F 1/20 361/719 |
| 2006/0012034 A1 | 1/2006 | Kadoya | | |
| 2010/0290190 A1 * | 11/2010 | Chester | | H05K 7/20772 361/701 |
| 2014/0224456 A1 | 8/2014 | Takasu | | |

FOREIGN PATENT DOCUMENTS

| | | |
|---|---|---|
| EP | 0456423 A2 | 11/1991 |
| JP | 2005223099 | 8/2004 |
| JP | 2004266247 | 9/2004 |
| JP | 2004266247 A | 9/2004 |
| JP | 2005223099 A | 8/2005 |
| JP | 2007306026 | 11/2007 |
| JP | 2007306026 A | 11/2007 |
| KR | 10-2014-0071029 | 6/2014 |
| KR | 20140071029 A * | 6/2014 |
| KR | 1020140071029 A | 6/2014 |

OTHER PUBLICATIONS

Toulouse, M.; "Exploration of a Potential-Flow-Based Compact Model of Air-Flow Transport in Data Centers," Nov. 13-19, 2009, Paper No. IMECE2009-10806, pp. 41-50; 10 pps.
Extended European Search Report, EP Application No. 16886745.5, dated Oct. 15, 2018, pp. 1-7, EPO.
International Search Report and Written Opinion, International Application No. PCT/US2016/014540, dated Oct. 20, 2016, pp. 1-9, KIPO.

* cited by examiner

ROUTING A COOLING MEMBER ALONG A BOARD

BACKGROUND

As global demand for data exchange has grown, so does a size and load placed on a server. As such, servers generate exponentially more power thus producing more heat.

BRIEF DESCRIPTION OF THE DRAWINGS

In the accompanying drawings, like numerals refer to like components or blocks. The following detailed description references the drawings, wherein.

DETAILED DESCRIPTION

A hybrid cooling system may be used to dissipate heat within a server. The hybrid cooling system utilizes both liquid cooling and air cooling to dissipate the heat from electrical components within the server. However, much of the heat may be dissipated from the liquid into the air. Increasing a number of cooling fans and/or increasing the airflow from the cooling fans are remedies aimed at cooling the dissipating heat. These remedies may result in a variety of other issues such as developing electro-static discharges, competition for the air space to properly cool the electrical components, vibrations from the cooling fans, corrosion, increasing noise within the server, etc. Additionally, dissipating the heat from the liquid into the air is inefficient as cooling fans work that much harder to expel the dissipated heat.

To address these issues, examples disclose a system which routes a cooling member along an under surface of the board to deliver liquid to and from an electrical component on a top surface of the board. The cooling member crosses a midpoint, between the surfaces, to deliver the cooling liquid. The cooling member routes the heated liquid back across the midpoint from the top surface to the bottom surface. Routing the cooling member along the bottom surface allows much of the surface area of the cooling member to be covered by the board. Covering the surface area, maximizes an amount of heat rejected into the liquid of the cooling member. Maximizing the amount of heat rejected into the liquid, means less heat is dissipated into the air. Decreasing the amount of heat dissipation in the air, allows the cooling fans to run at lower fan speeds to circulate cooler air within the server. Additionally decreasing the heat dissipation to the air, minimizes the number of cooling fans used, thus saving space within the server. Further decreasing the number of cooling fans and fan speed, cooling fan reliability increases. Overall, the reduced number of cooling fans and fan speed reduces power consumption.

In another example, the cooling member and board are installed in a server tray. Routing the cooling member on the under surface of the board, reduces the tray impedance and allows for a greater array of server configurations to be supported.

Figure 1A:
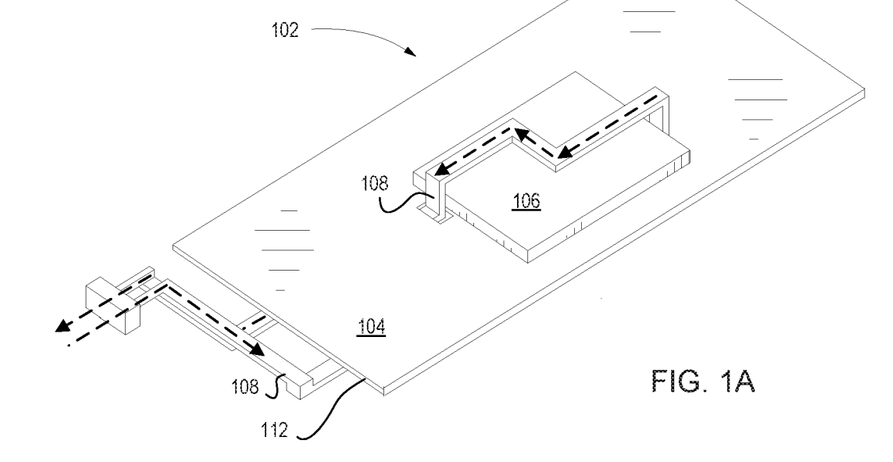
FIGS. 1A-1B illustrate perspective views of an example board including a cooling member to deliver liquid to and from an electrical component in accordance with the present disclosure.
Figure 1B:
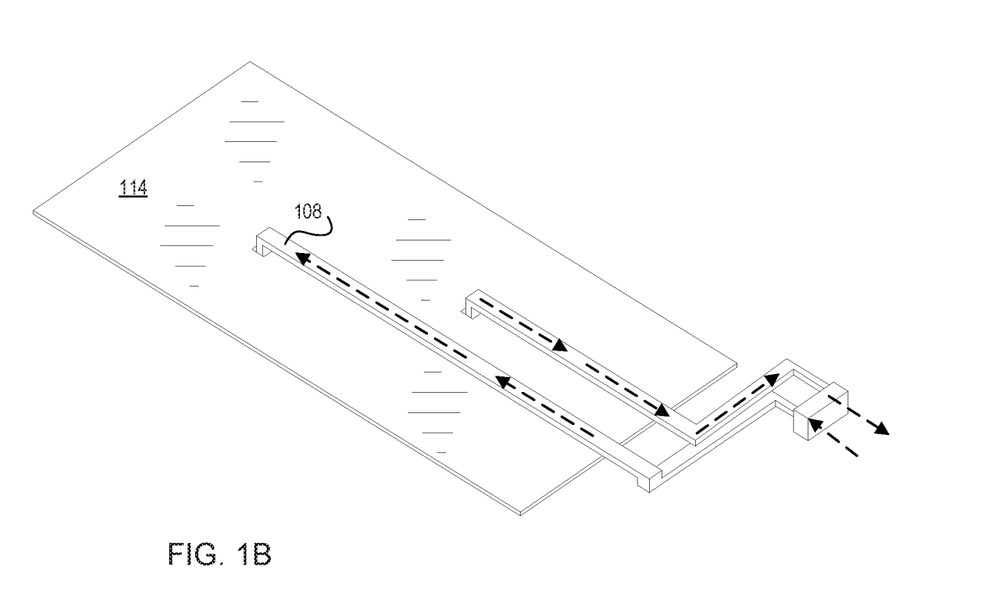

FIGS. 1A-1B illustrate perspective views of an example board 102 including a cooling member 108. The cooling member 108 is routed along an under surface 114 of the board 102 to deliver cooling liquid to electrical component 106. The electrical component 106 is located on top surface 104 of the board 102. The cooling member 102 is routed to the electrical component 106 by crossing midpoint 112. The cooling member 108 delivers cooling liquid to draw away thermal energy from the component 106, In this manner, the thermal energy (e.g., heat) is drawn into the cooling liquid to produce heated liquid. Upon producing the heated liquid, the cooling member 108 crosses back over the midpoint 112 and routes the heated liquid on the under surface 114 of the board 102. FIGS. 1A-1B represent a server system in a data center for data exchange, computation, storage, etc. As such, implementations of the server may include, a database server, mail server, file server, domain name system (DNS) server, print server, web server, game server, application server, cartridge server, blade server, catalog server, communication server, home server, media server, proxy server, or other type of computing device capable of data exchange. Although FIGS. 1A-1B illustrate the board 102 as including the cooling member 108 and the electrical component 106, implementations should not be limited as this was done for illustration purposes. For example, the board 102 may include a connector coupled to the cooling member 108 and heat exchanger above the electrical component 106. This is discussed in detail in later figures.

The board 102 is a printed circuit board which mechanically supports and electrically connects electrical components using conductive tracks, pads, or other features. The electrical connections on the board 102 are created through an etching of a copper sheet which is laminated onto a non-conductive substrate. The board 102 contains the components (e.g., electrical component 106) for operation of the server. As such, in this implementation the board 102 includes a motherboard for installation into the server. The board 102 includes at least two surfaces, the top surface 104 and the under surface 114. In one implementation, the board 102 includes holes on the surfaces 104 and 114 for penetration by the cooling member 108. Alternatively, the cooling member 108 may be routed up to the top surface 104 through the edge of the board 102.

The top surface 104 and the under surface 114 may also be referred to as a first surface and a second surface, accordingly. These surfaces 104 and 114 are parallel to one another such that a plane of the top surface 104 extends in the same line as the under surface 114. Between the surfaces 104 and 114, lies the midpoint 112. If each of the surfaces 104 and 114 infinitely extended, then the midpoint 112 is considered the middle plane between both of the surfaces 104 and 114. As such, the midpoint 112 is an imaginary point on this middle plane.

The electrical component 106, located on the top surface 104 of the board 102, is a discrete device or physical entity in the server which is used to affect electrons or their associated fields. The electrical component 106 may include, by way of example, an integrated circuit, semiconductor, memory module, central processing unit (CPU), processing resource, application-specific integrated circuit (ARC), controller, processor, chipset, or other type of hardware component.

The cooling member 108 is a duct which carries liquid, such as water, to and from the electrical component 106. The cooling member 108 carries the cooling liquid to the electrical component 106 by crossing the midpoint 112 from the bottom surface 114 to the top surface 104. Upon delivering the cooling liquid, the cooling member 108 draws away the heat from the electrical component into the liquid. This heated liquid is carried by the cooling member 108 through the midpoint 112 from the top surface 104 to the bottom surface 114. Crossing back over the midpoint 112, the cooling member 108 routes the heated liquid along the under surface 114 of the board 102 and out of the server. The cooling member 108 may include, for example, a pipe, channel, tube, or other type of physical structure which can carry liquid from the under surface 114 of the board 102 across the midpoint 112 to the electrical component 106. Although the cooling member 108 is illustrated as one continuous component, implementations should not be limited as this was done for illustration purposes. For example, the cooling member 108 may include a first member and a second member routed along the under surface 114 and connected through a heat exchanger on top of the electrical component 106. This is discussed in detail in later figures.

FIG. 1A illustrates the flow of liquid carried through the cooling member 108 from the under surface 114 of the board 102. The liquid ingresses through the cooling member 108 at the under surface 114 across the midpoint 112 through the board 102. The cooling member 108 reaches the electrical component 106 to deliver cooling liquid. Upon the delivery of the cooling liquid, heat is transferred to the liquid and carried out by the cooling member 108. The cooling member 108 routes the heated liquid from the top surface 104 through the board 102 to the under surface 114 of the board 102.

FIG. 1B illustrates the routing of the cooling member 108 on the under surface 108 of the board 102. As illustrated in the figure, the liquid is carried in the cooling member 108 along the under surface 114 up through the board 102 to the top surface 104 of the board 102. The heated liquid is carried by the cooling member 108 from the top surface 104 along the under surface 114.

Figure 2A:
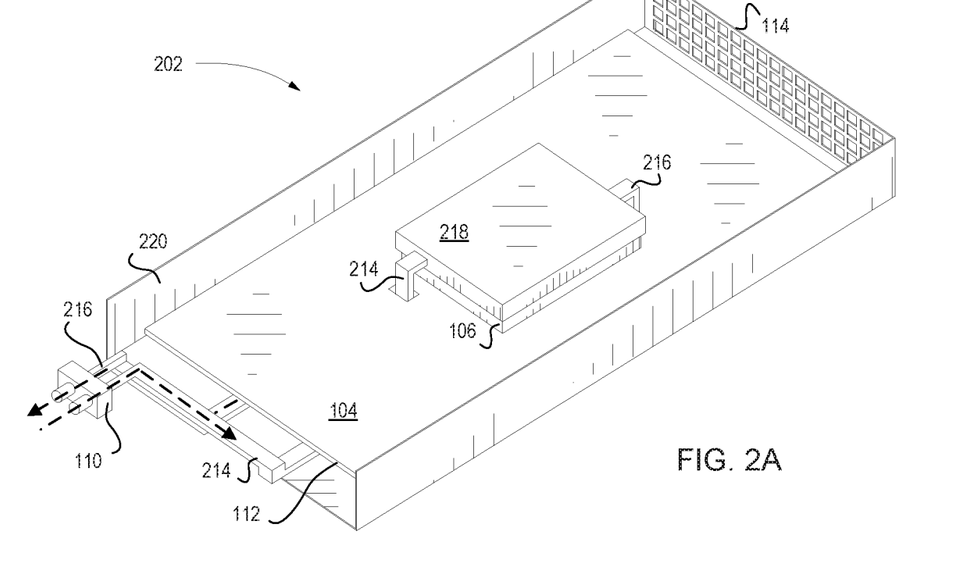
FIGS. 2A-2B illustrate perspective views of an example system including a board installed in a server tray in accordance with the present disclosure.
Figure 2B:
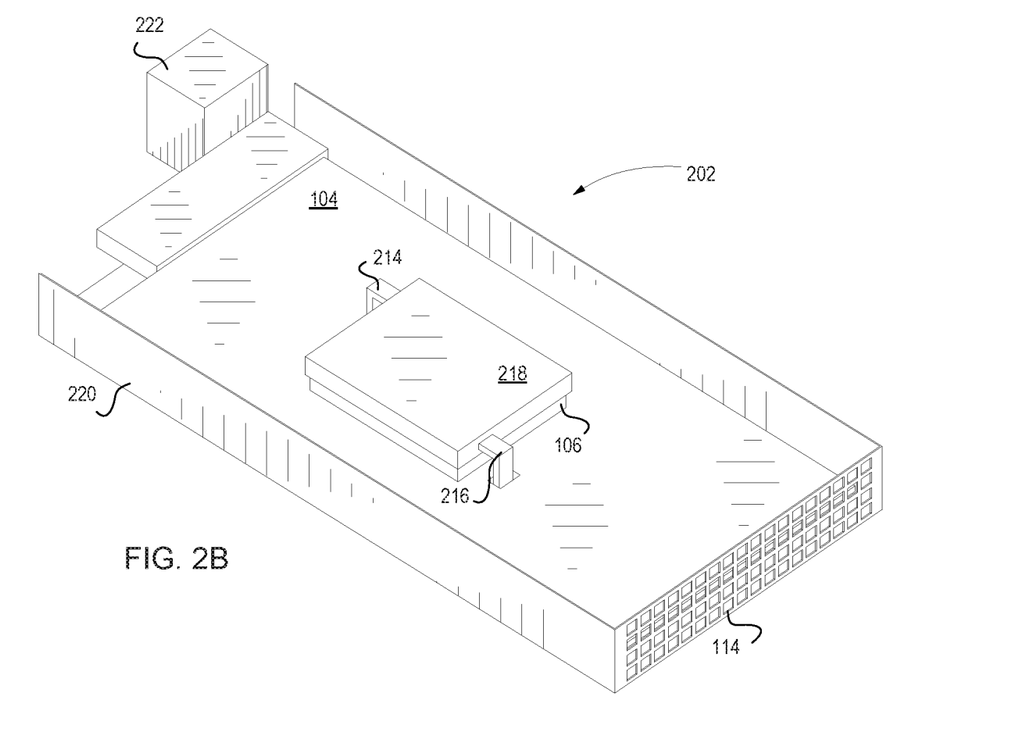

FIGS. 2A-2B illustrate perspective views of an example server 202 including an electrical component 106 on a top surface 104 of a board. Above the electrical component 106, a first member 214 delivers cooling liquid into a heat exchanger 218 and a second member 216 routes heated liquid from the electrical component 106. A connector 110 is coupled to the first member 214 and a second member 216, to provide an ingress of the cooling liquid through the first member 214 and an egress of the heated liquid from the second member 216. A server tray 220 retains the board with the members 214 and 216 routed along on the under surface or underside of the board. In this implementation, the members 214 and 216 are routed along the under surface (not illustrated) of the hoard and are located between the bottom portion of the server tray 220 and the board. The server tray 220 uses the under surface illustrated) of the board to route the members 214 and 216 for liquid distribution. As such, the members 214 and 216 may be rectangularly or pipe shaped to fit into a minimal clearance between the under surface of the board and a bottom surface of the tray 220. The board includes holes or penetration points in which the members 214 and 216 may cross over the midpoint 112 of the hoard to reach the top surface 104. Alternatively, the members 214 and 216 cross the midpoint 112 from the edge of the board. Through placement of the members 214 and 216 on the under surface of the board, the members 214 and 216 are not exposed to the airflow, which allows a percentage of heat rejected to the liquid to be minimally impacted. The members 214 and 216 are considered part of a cooling member, such as the cooling member 108 in FIG. 1. The members 214 and 216 deliver cooling liquid to the electrical component 106 and routes heated liquid from the electrical component 106 for cooling purposes. The server 202 includes a front facing wall with holes 114 that allows the intake of air from outside. Additionally, the server 202 may include a fan (not illustrated) to circulate the air and provide the airflow within the server 202.

FIG. 2A illustrates the server 202 from the rear perspective with the connector 110 coupled to both the first member 214 and the second member 216. The connector 110 includes protruding members which are used to couple to the hack of a chassis. Coupling the connector 110 to the back of the chassis, provides a centralized location in which to direct the ingress and egress of the liquid from a server tray to the rack. This implementation will be discussed in detail in later figures. Although FIG. 2A illustrates the connector 110 as a single component coupling to both members 214 and 216, implementations should not be limited as this was done for illustration purposes. For example, the connector 110 may be separated for separately coupling to each member 214 and 216.

The heat exchanger 218, mounted above the electrical component 106 on the top surface 104 of the board, includes an inlet and outlet to route liquid for cooling purposes. The inlet is connected to the first member 214 to receive the cooling liquid. The cooling liquid is then routed through the heat exchanger 218 to draw away heat from the electrical component 106. The outlet of the heat exchanger 218 is connected to the second member 216 to egress or route out the heated liquid. The heat exchanger 218 is a device which transfers heat from the electrical component 106 to the cooling liquid such that the transferred heat produces the heated liquid. The heat exchanger 218 may include a combination between thermally resistive material and thermally conductive material. In this implementation, the surfaces of the heat exchanger 218 exposed to the air is comprised of thermally resistive material while the surface of the heat exchanger 218 exposed to the electrical component 106 is comprised of thermally conductive material to maximize the heat rejection from the electrical component 106 into the liquid. In a further implementation, the heat exchanger 218 includes a cooling coil routed on top of the electrical component 106 to draw way the heat produced by the electrical component 106.

The server tray 220 is used to hold the board with the installed cooling members 214 and 216, electrical component 106, and the heat exchanger 218. The server tray 220 includes the enclosure to hold the board and various components to constitute the server 202. As such, the server tray 220 provides the structure in which to install the server 202 within a chassis. Providing the structure, multiple servers 202 may fit into the server chassis while also providing internal separation between each of the servers 202. The server tray 220 includes a bottom surface, at least two side walls, and a front wall with holes 114. The front wall with the holes 114 is considered the front facing wall which allows the intake of air to provide the airflow for the fan to circulate. In an implementation, the bottom surface of the server tray 202 may include a structure to provide a tolerance of space such that the members 214 and 216 are not in contact with the server tray 220. In this implementation, the members 214 and 216, or also referred to as the cooling member, is between the bottom portion of the server tray 220 and the board. The server tray 220 may be composed of various materials including but not limited to: metal, ceramic, plastic, polyurethane, etc.

FIG. 2B illustrates the server 202 from the front perspective including the holes 114 to intake air within the server 202. The connector 110 as in FIG. 2A includes a connector cover 222 which insulates the thermal energy within the coupled members 214 and 216. In this implementation, the connector cover 222 insulates the connector 110 to prevent thermal energy (e.g., heat) from dissipating into the air. Using the connector cover 220 increases the amount of heat which is rejected into the liquid flowing through the members 214 and 216.

Figure 3A:
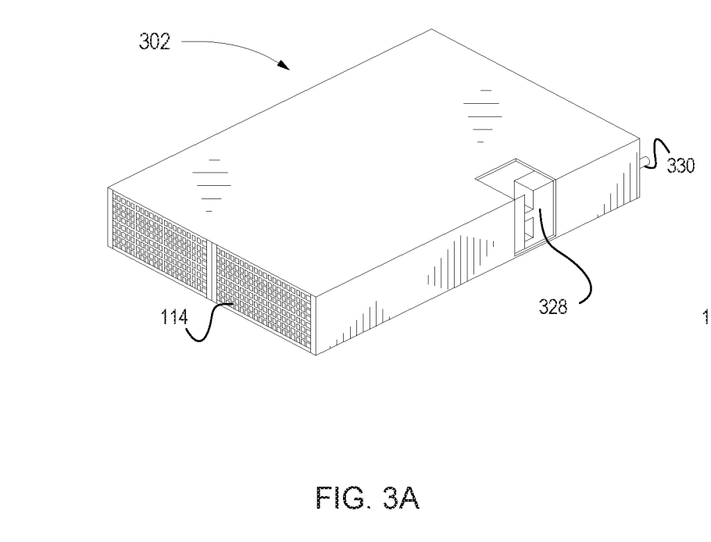
FIGS. 3A-3B illustrate perspective views of an example system including a cutout from a chassis for view clarification in accordance with the present disclosure.
Figure 3B:
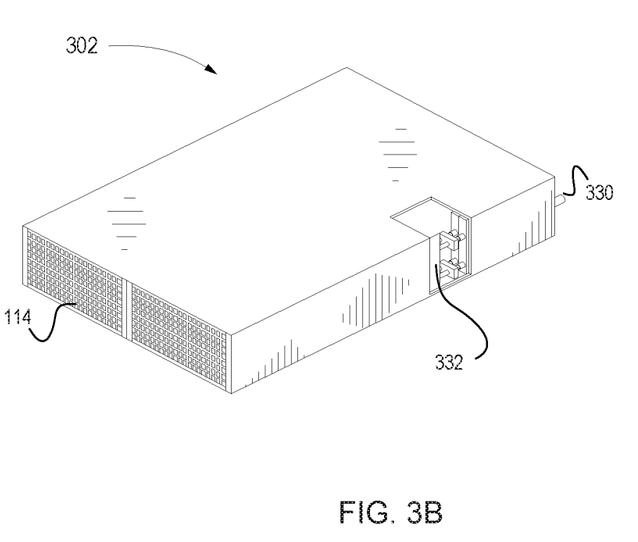

FIGS. 3A-3B illustrate various perspective views of a system including a cutout from a chassis 302 for view clarification. These figures illustrate the chassis 302 which includes multiple installed servers. The cooling member and board are part of the installed server internal to the chassis 302 and as such may not be illustrated in these figures. The back end of the chassis 302 includes a member 330 which protrudes and couples with an insulated rack manifold to further prevent heat dissipation into the surrounding air. In this implementation, the manifold is placed towards the rear of the chassis 302 out of the path of the air flow circulated internally to each server. This implementation is discussed in detail in later figures.

In FIG. 3A, the cut out from the chassis 302 includes a connector cover 328 and chassis partition shield to shield the connectors from the air flow. The connector cover 328 and chassis partition shields the duct work which delivers liquid to and from each of the servers installed within the chassis 302. Shielding the duct work through the connector cover and chassis partition, prevents heat from dissipating into the air and increases the amount of heat rejected into the liquid. The connector cover 328 may be composed of various thermal insulating materials including, but not limited to, a resin, plastic, foam, polyurethane, metal, or other type of insulating material which insulates heat from dissipating into the air internal to the chassis 302. This increases the amount of heat which is rejected into the liquid and delivered from the chassis 302.

In FIG. 3B, the front of the chassis 302 is illustrated with holes 114 used to intake air to allow airflow in addition to fans internal to the chassis 302. The chassis 302 includes the cutout from the enclosure to illustrate the partition cover 332. The partition cover 332 illustrates the tubing for the delivery of the cooling liquid and heated liquid to and from each of the servers within the chassis 302. As such, the tubing connects to the partition cover 332 which in turn couples to the manifold. The partition cover 332 illustrates the tubing and connector without the cover 328 illustrated in FIG. 3A.

Figure 4A:
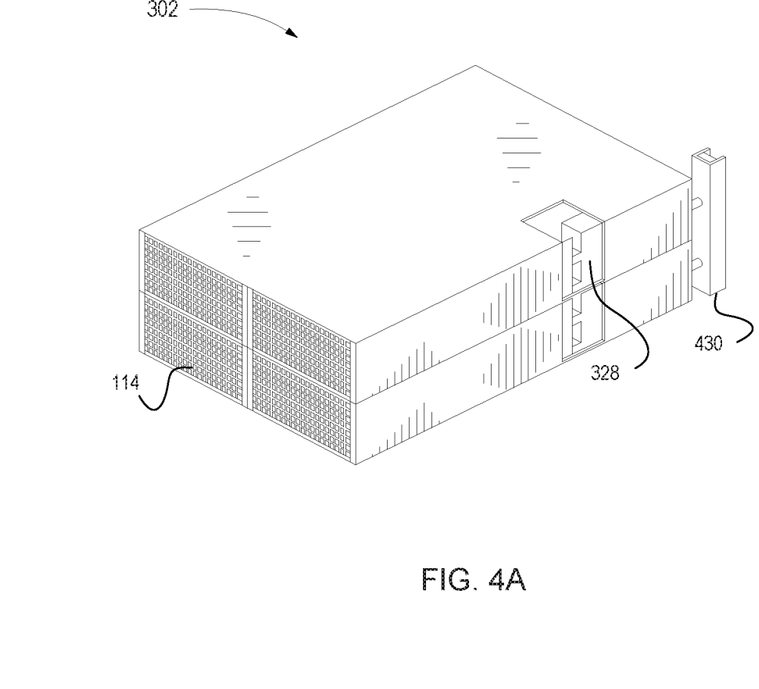
FIGS. 4A-4B illustrate perspective views of an example system including multiple servers installed within a chassis and a manifold in accordance with the present disclosure.
Figure 4B:
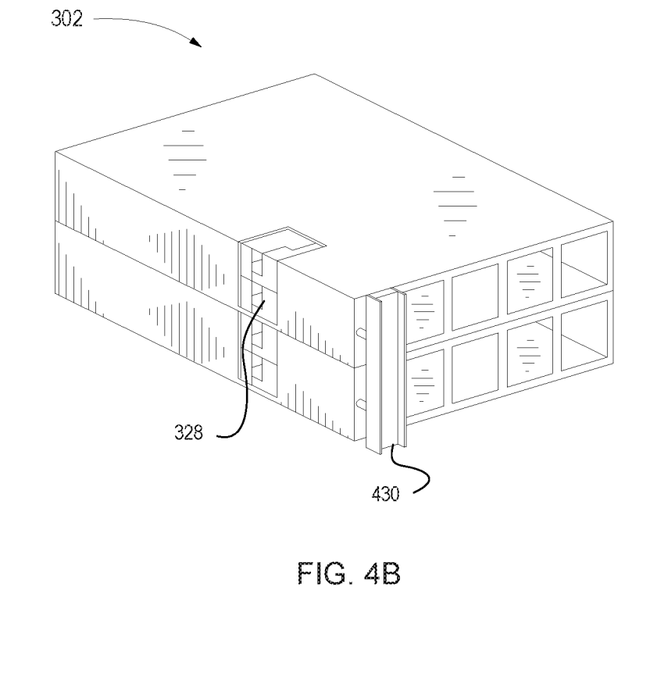

FIGS. 4A-4B illustrate perspective views of an example system including multiple servers installed within a chassis 302. Each chassis includes a manifold 430 which is used to route tubing in which to deliver cooled liquid and heated liquid to and from each of the servers within the chassis 302. The manifold 430 is installed towards the rear of the chassis 302 and includes a chamber or pipe which holds the tubing or piping for the delivery of cooling liquid and heated liquid to and from each server within the chassis 302. The chassis 302 is considered stacked on top of another chassis to hold the multiple servers. Another area of potential heat dissipation into the air is the manifold 430 towards the rear of the chassis 302. As such, the manifold 430 is placed to the outside of the chassis 302 and in turn server rack (not illustrated) which is out of the path from the air circulation internal to each of the multiple servers and the air exiting the chassis 302.

In FIG. 4A, the system is illustrated from a front perspective with holes 114, the connector cover 328, and the manifold 430 installed on the back end of the chassis and in turn a server rack. In one implementation, the manifold 430 is covered to shield the manifold from air exiting the chassis 302. In this implementation, the manifold 430 may include coverings on the sides or edges of the chamber to block the air from mixing with the manifold 430.

In FIG. 4B, the system is illustrated from a back perspective with the connector cover 328 cutout from the chassis 302 for clarification purposes. The manifold 430 is viewed from the front illustrating the shield as the side edges. The shield is used to protect the tubing (not illustrated) within the manifold 430 from air exiting the chassis.

Figure 5:
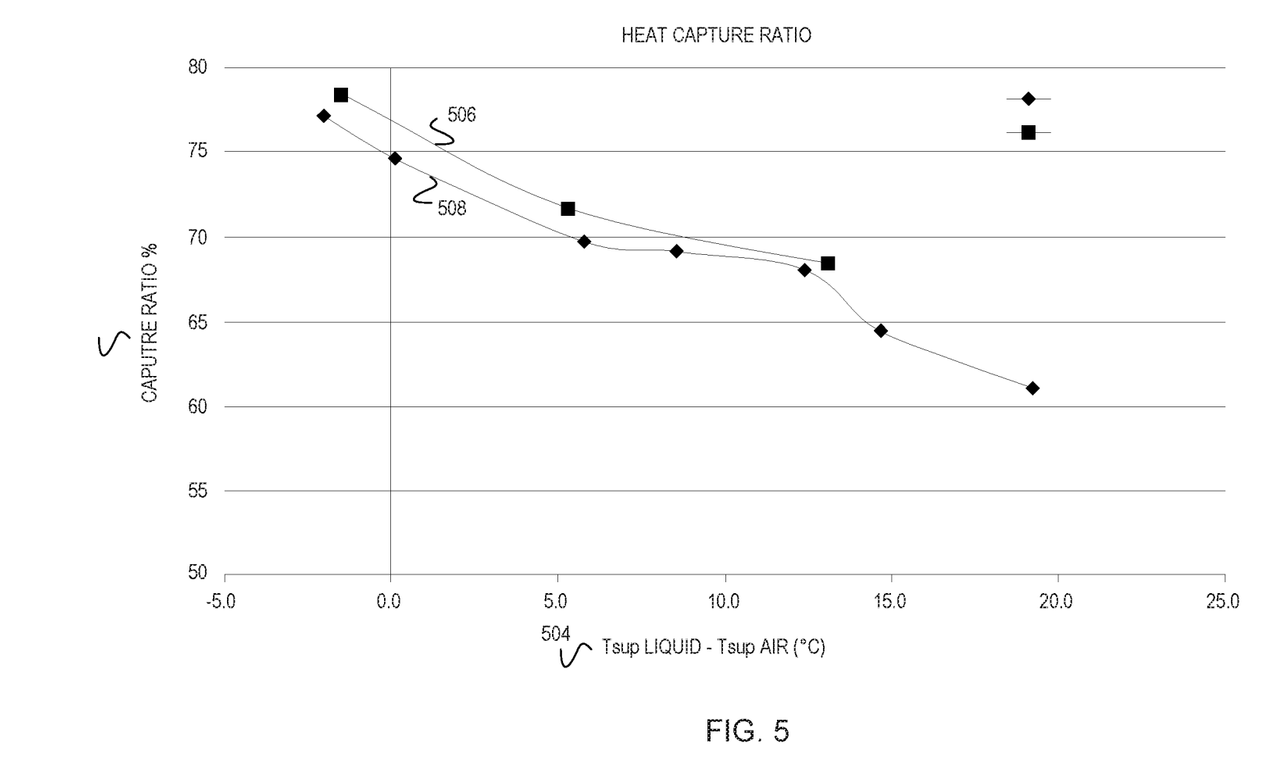
FIG. 5 illustrates an example graph representing various airflow rates in accordance with the present disclosure.

FIG. 5 illustrates an example graph representing various airflow rates in accordance with the present disclosure. The graph illustrates an amount of heat captured or the percent of heat rejected to liquid in a cooling member. As such, the graph represents a maximum percent of heat rejected into the liquid in accordance with the present disclosure.

The y-axis 502 represents a percent of heat that is captured by the liquid rejected into the liquid. The x-axis 504 represents a temperature difference between the temperature of the liquid entering the cooling member and the temperature of the air entering the front of the server. As such, the x-axis 504 represents the thermal energy difference in temperature between the liquid and entering air temperature. A higher airflow rate 508 is illustrated on the graph in relation to a lower airflow rate 506. The higher airflow rate 508 represents the flowrate with additional cooling resources, such as funs. As such, the higher flowrate 508 may include when the fans are in higher numbers and/or higher operation speeds. The lower airflow rate 506 represents the flowrate without the additional cooling resources and/or without the higher operating speeds of the fans.

For the lower airflow rate 506, the percent of heat rejected to the liquid in the cooling member is higher than the higher airflow rate 508 at the same value of the temperature difference on the x-axis 504. This highlights with the higher airflow rate 508, the convective heat transfer for the air is higher, meaning more heat is lost to the air; the heat lost to the air also increases with the amount of cooling member surface area exposed to the air. Thus, the lower airflow rate 506 minimizes the airflow rate and in turn maximizes the amount of heat rejected into the liquid. If the temperature difference on the x-axis 504 is low (e.g., the liquid temperature is close to the air temperature), there is a minimal temperature gradient, so the heat lost to the air is minimized. Thus, increasing the percent of the capture ratio, or the percent of heat rejected into the liquid, reduces the overall amount of cooling air flow needed for cooling which in turn reduces the resources for cooling.

Figure 6:
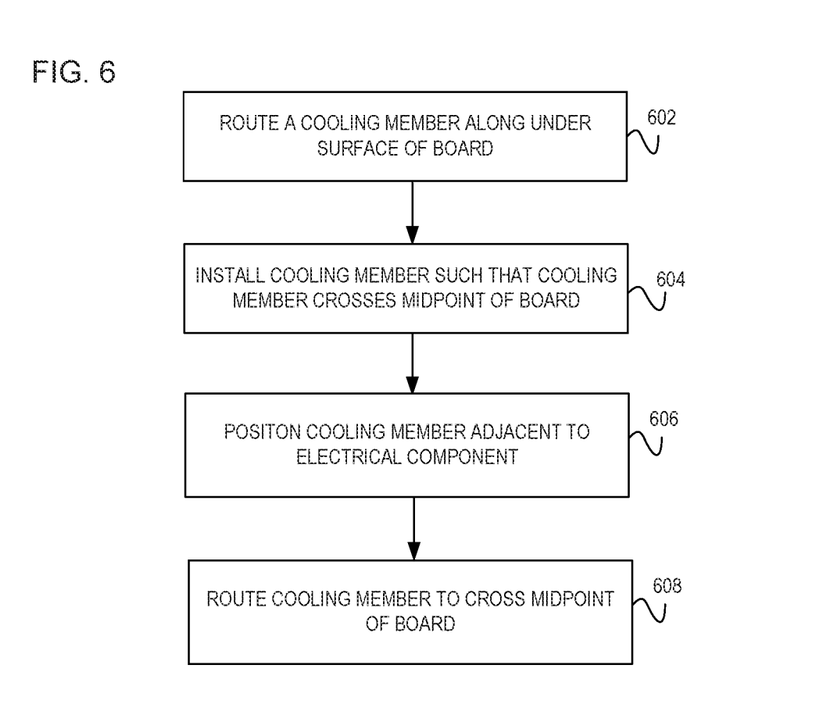
FIGS. 6-7 illustrate example flow diagrams for manufacturing a board and a cooling member such that the cooling member is routed along an under surface of the board.
Figure 7:
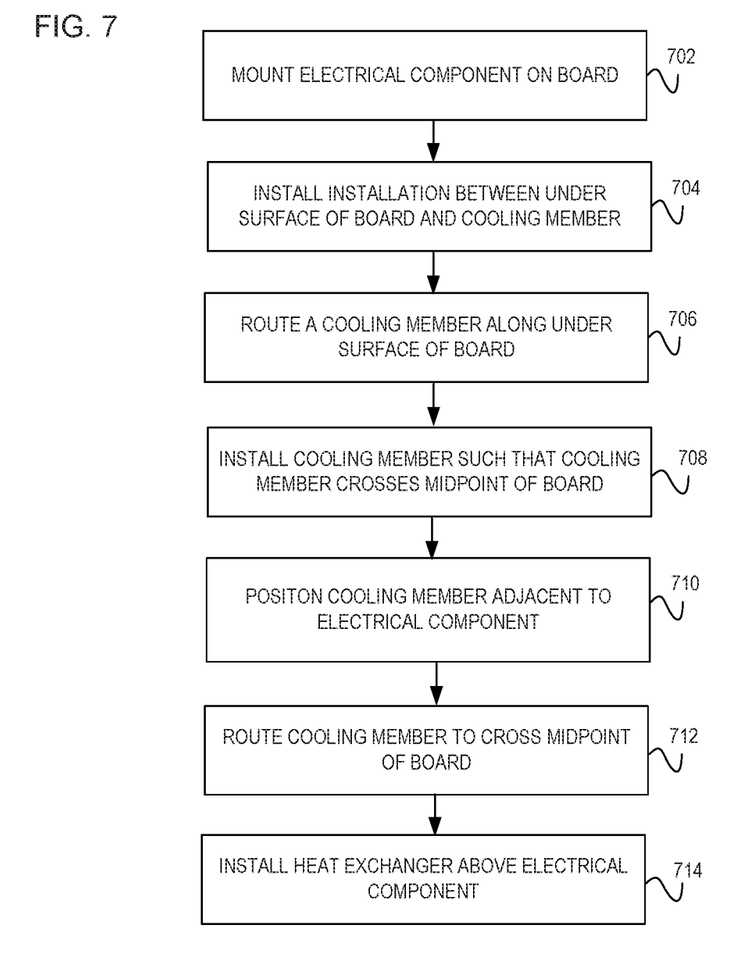

Referring now to FIGS. 6 and 7, flow diagrams are illustrated in accordance with various examples of the present disclosure. The flow diagrams represent processes that may be utilized in conjunction with various systems and devices as discussed with reference to the preceding figures. While illustrated in a particular order, the flow diagrams are not intended to be so limited. Rather, it is expressly contemplated that various processes may occur in different orders and/or simultaneously with other processes than those illustrated.

FIG. 6 is a flow diagram illustrating a method of manufacturing the cooling member on the board. The method may begin at operation 602 where the cooling member is routed along an under surface of a hoard. The cooling member is a physical device which delivers liquid to and from the top surface of the board. As such, the cooling member provides coolant and removes heated liquid during operation. The method for manufacture proceeds to install the cooling member such that the member crosses a midpoint of the board. Installing the cooling member to cross the midpoint of the hoard from the bottom surface to the top surface, the cooling member is positioned adjacent to the electrical component. Upon positioning the cooling member adjacent to the electrical component, the cooling member may be routed back across the midpoint from the top surface to the under surface. Routing the cooling member along the bottom surface allows much of the surface area to be blocked by the board and/or insulation. Covering the surface area of the cooling member maximizes the amount of heat rejected into a liquid when the cooling member is in operation.

At operation 602, the method of manufacture may begin by routing the cooling member along the under surface of the board. The under surface is parallel to the top surface so that the midpoint is considered an imaginary point on a plane between both the under surface and the top surface. This midpoint on the plane between surfaces is crossed to route the cooling member to the electrical component.

At operation 604, upon the routing of the cooling member on the under surface of the board, the cooling member is installed across the midpoint from the under surface to the top surface. Crossing the midpoint includes, by way of example: penetrating the board to reach to the top surface; crossing the plane which extends from the middle area of the board; and crossing the middle of the board by reaching across the edge to reach the top surface.

At operation 606, upon the cooling member being routed along the under surface of the board and across the midpoint, the cooling member is positioned adjacent to the electrical component. Positioning the cooling member adjacent to the electrical component indicates placing the cooling member next to or adjoining to the electrical component. This means the cooling member may be positioned such that the cooling member is adjoined to the electrical component. Adjoining to the electrical component may include positioning the cooing member on top of, next to, or below the electrical component, Positioning the cooling member adjacent to the electrical component, enables the cooling member to provide a liquid for cooling the electrical component on the board.

At operation 608, upon the cooling member being positioned adjacent to the electrical component, the cooling member is routed to the top surface to the under surface of the board. In this implementation, this may include routing the cooling member to cross back over the midpoint from the top surface to the under surface. Crossing the cooling member back over the midpoint from top surface to the under surface, means the cooling member crosses over the plane or middle area of the board to route back along the under surface.

FIG. 7 is a flowchart of an example method to manufacture a board including an installation of an electrical component and a cooling member. The method may proceed to initially mount an electrical component on a top surface of the board and installs installation between an under surface of the board and the cooling member. The cooling member is routed along the under surface of the board and across a midpoint of the board. Upon installing the cooling member to cross the midpoint of the board, the cooling member is positioned adjacent to the mounted electrical component on the top surface of the board. Based on the positioning the cooling member adjacent to the electrical component, the cooling member is routed to cross back over the midpoint from the top surface to the under surface. The method proceeds to install a heat exchanger on the top surface of the board, above the electrical component.

At operation 702, the method may begin by mounting the electrical component on the top surface of the board. Mounting the electrical component may include adhering the component such that the electrical contacts are connected with the contacts on the board. Examples of mounting the electrical component include, by way of example: mechanically connecting the electrical component to the board, soldering, gluing, or creating an electrical connections between the electrical component and the board.

At operation 704, insulation is installed between the under surface of the board and the cooling member. The insulation reduces the heat transfer between the board and the cooling member. As such, the insulation may be composed of a variety of materials to reduce dissipation of heat into the air. This ensures the maximum amount of heat is rejected into the liquid of the cooling member. As such, the insulation material may include, by way of example, resin, plastic, polyurethane, fiberglass, foam, paint, etc. In one implementation, the insulation is installed on the board to prevent thermal energy escaping into the board. In another implementation, the insulation is installed on the cooling member to maximize the amount of heat rejected into the liquid.

At operation 706, upon the mounting of the electrical component and installation of the insulation, the cooling member is routed along the under surface of the board. Operation 706 may be similar in functionality to operation 602 as in FIG. 6.

At operation 708, the cooling member is installed in such a way that the cooling member is routed along the under surface of the board and across the midpoint to the top surface of the board. Operation 708 may be similar in functionality to operation 604 as in FIG. 6.

At operation 710, the cooling member is positioned adjacent to the electrical component on the top surface of the board. Positioning the electrical component adjacent to the processing component allows the thermal energy from the cooling member to transfer to the electrical component. This thermal energy may include heating and cooling the electrical component if the environment is operating in sub-optimal temperatures. Operation 710 may be similar in functionality to operation 606 as in FIG. 6.

At operation 712, the cooling member is routed from the position adjacent to the electrical component on the top surface of the board to the under surface of the board. In this implementation, the cooling member is routed to cross back over the midpoint from the top surface to the under surface of the board. Operation 712 may be similar in functionality to operation 608 as in FIG. 6.

At operation 714, the heat exchanger is installed on the top surface of the board. The heat exchanger is positioned above the electrical component on the top surface of the board. As such, the installation of the heat exchanger includes coupling to the cooling member to ingress and egress liquid from the heat exchanger. This means the heat exchanger coupled to the cooling member is positioned above the electrical component for delivery of cooling liquid for cooling purposes or heated liquid for warming purposes. In a further implementation of operation 714, the board with the installed cooling member and electrical component are installed into a server tray. The server tray may then be installed into a chassis. Upon installing the server tray in the chassis, a manifold may be installed on the outer portion of the chassis such that liquid may ingress and egress into cooling members installed on each board within each server tray. In this manner, the manifold serves as a centralized ingress and egress to the cooling members.

Although certain embodiments have been illustrated and described herein, it will be greatly appreciated by those of ordinary skill in the art that a wide variety of alternate and/or equivalent embodiments or implementations calculated to achieve the same purposes may be substituted for the embodiments shown and described without departing from the scope of this disclosure. Those with skill in the art will readily appreciate that embodiments may be implemented in a variety of ways. This application is intended to cover adaptions or variations of the embodiments discussed herein. Therefore, it is manifestly intended that embodiments be limited only by the claims and equivalents thereof.

We claim:

1. A system comprising:
a board including a first surface, a second surface, and a midpoint between the first and the second surface, the board to support an electrical component on the first surface of the board, the electrical component having a first surface adjacent to the first surface of the board, and a second surface;
a plurality of joined pipes, portions of the joined pipes routed adjacently along the second surface of the board, to:
deliver cooling liquid to the second surface of the electrical component by the pipes crossing the midpoint of the board from the second surface of the board to the first surface of the board; and
route, along the second surface of the board, heated liquid from the second surface of the electrical component by the pipes crossing the midpoint of the board from the first surface of the board to the second surface of the board.

2. The system of claim 1 comprising:
a heat exchanger, mounted above the electrical component on the first surface of the board, comprising:
an inlet to receive the cooling liquid from the pipes; and
an outlet to egress the heated liquid to the pipes.

3. The system of claim 1 wherein crossing the midpoint of the board, the pipes penetrate the board to deliver the cooling liquid and route the heated liquid.

4. The system of claim 1 wherein the first surface of the board and the second surface of the board are parallel to each other.

5. The system of claim 1 comprising:
a server tray, below the second surface of the board, to retain the board.

6. The system of claim 1 further comprising:
a server tray to retain the board;
a chassis to support multiple servers; and
a manifold, coupled to the chassis, to route the cooling liquid to and the heated liquid from each of the multiple servers.

7. The system of claim 1, wherein the portions of the joined pipes are routed horizontally along the second surface of the board.

8. The system of claim 5, wherein the pipes are between the tray and the second surface of the board.

9. A method comprising:
routing portions of a plurality of joined pipes adjacently along a second surface of a board, the board including a first surface, the second surface, and a midpoint between the first surface of the board and the second surface of the board;
installing the pipes such that the pipes cross the midpoint of the board from the second surface to the first surface of the board;
positioning the pipes adjacent to a second surface of an electrical component to deliver cooling liquid to the second surface of the electrical component, wherein the electrical component is disposed on the first surface of the board, and wherein a first surface of the electrical component is positioned adjacent to the first surface of the board; and
routing the pipes from the second surface of the electrical component to the second surface of the board to route, along the second surface of the board, heated liquid from the second surface of the electrical component.

10. The method of claim 9 comprising:
mounting the electrical component to the first surface of the board.

11. The method of claim 9 comprising:
installing a heat exchanger above the electrical component and the pipes on the first surface of the board.

12. The method of claim 9 comprising:
installing the board with the pipes and an electrical component into a server tray;
installing the server tray into a chassis; and
installing a manifold to route a cooling liquid and a heated liquid to and from the chassis.

13. The method of claim 9, wherein routing includes routing the portions of the of joined pipes horizontally along the first surface of the board.

14. The method of claim 9, wherein the first surface and the second surface of the board are parallel to each other.

15. A cooling structure comprising:
a first pipe and a second pipe coupled to the first pipe, portions of the first pipe and the second pipe routed adjacently along a second surface of a board, the first pipe to:
cross a midpoint between the second surface and a first surface of the board;
deliver cooling liquid to a second surface of an electrical component located on the first surface of the board, the electrical component having a first surface adjacent to the first surface of the board; and
the second pipe to:
receive heated liquid from the second surface of the electrical component located on the first surface of the board; and
route, along the second surface of the board, the heated liquid from the second surface of the electrical component by crossing the midpoint of the board from the first surface of the board to the second surface of the board.

16. The cooling structure of claim 15 comprising:
a connector, coupled to the first pipe and the second pipe, to:
provide an ingress of the cooling liquid to the first pipe; and
provide an egress of the heated liquid from the second pipe.

17. The cooling structure of claim 15 wherein to cross the midpoint of the board, the first pipe and the second pipe penetrate the board.

18. The cooling structure of claim 15, wherein the portions of the plurality of pipes are routed horizontally along the first surface of the board.

19. The cooling structure of claim 15, wherein the first surface and the second surface of the board are parallel to each other.

20. The cooling structure of claim 16, further comprising a connector cover to insulate the connector.

\* \* \* \* \*